United States Patent [19]

Matsuki et al.

[11] Patent Number: 5,065,223

[45] Date of Patent: Nov. 12, 1991

[54] PACKAGED SEMICONDUCTOR DEVICE

[75] Inventors: Hirohisa Matsuki, Kawasaki; Shigeki Harada, Musashino; Masahiro Sugimoto, Yokosuka; Toshiki Yoshida, Minokamo, all of Japan

[73] Assignees: Fujitsu VLSI Limited, Kasugai; Fujitsu Limited, Kawasaki, both of Japan

[21] Appl. No.: 531,457

[22] Filed: May 31, 1990

[30] Foreign Application Priority Data

May 31, 1989 [JP] Japan .................................. 1-137889

[51] Int. Cl.⁵ ...................... H01L 27/10; H01L 23/48
[52] U.S. Cl. ......................................... 357/68; 357/71
[58] Field of Search ............................... 357/70, 68, 71

[56] References Cited

U.S. PATENT DOCUMENTS

| | | | |
|---|---|---|---|
| 3,921,194 | 11/1975 | Engeler et al. | 357/71 |
| 4,289,834 | 9/1981 | Alcorn et al. | 357/71 |
| 4,594,606 | 6/1986 | Goto et al. | 357/68 |
| 4,613,891 | 9/1986 | Ng et al. | 357/69 |
| 4,634,496 | 1/1987 | Mase et al. | 357/71 R |
| 4,668,581 | 5/1987 | Luc et al. | 357/69 |
| 4,698,663 | 10/1987 | Sugimoto et al. | 357/81 |
| 4,742,024 | 5/1988 | Sugimoto et al. | 437/211 |

*Primary Examiner*—Andrew J. James
*Assistant Examiner*—Viet Q. Nguyen
*Attorney, Agent, or Firm*—Staas & Halsey

[57] ABSTRACT

A semiconductor device includes a semiconductor chip, a substrate for supporting the semiconductor chip, a plurality of terminals provided on the substrate for external connections, a plurality of lead wires provided on the semiconductor chip for connections to the terminals, and a multilevel interconnection structure for connecting the plurality of terminals to the plurality of lead wires on the semiconductor chip. The multilevel interconnection structure includes at least a lower conductor layer provided on the substrate and patterned into a plurality of pattern portions connected electrically to the terminals, an insulator layer provided on the lower conductor layer, and an upper conductor layer provided above the insulator layer. The upper conductor layer is formed with a connection area immediately below the lead wires on the semiconductor chip when the semiconductor chip is mounted on the substrate, the upper conductor layer is patterned in the connection area into a plurality of conductor strips extending parallel with each other in correspondence to the lead wires, the insulator layer is provided with contact holes so as to connect electrically the conductor strips of the upper conductor layer with the pattern portions of the lower conductor layer. In the semiconductor device, each of the pattern portions in the connection area has an edge extending obliquely to the conductor strips of the upper conductor layer wherein the pattern portions are disposed so that a pair of adjacent pattern portions have respective edges opposing with each other and extending parallel with each other with a lateral gap extending therebetween.

10 Claims, 9 Drawing Sheets

PACKAGED SEMICONDUCTOR DEVICE

BACKGROUND OF THE INVENTION

The present invention relates in general to semiconductor devices and more particularly to a packaged semiconductor device having a package substrate supporting a semiconductor chip.

In a typical packaged semiconductor device, a semiconductor chip is mounted on a package substrate made of ceramic or heat resistant resin. In order to achieve the electric connection to external circuits, minute leads are provided on the semiconductor chip so as to project from the periphery thereof and these minute leads are connected to connection pins provided on the package substrate.

Electric connection between the minute leads and the connection pins are made conventionally either using a so-called wire bonding process wherein each of the minute leads is connected to a corresponding connection pin by a thin wire or using a process called wireless bonding. In the wireless bonding process, the semiconductor chip is mounted face downward, for example, to the substrate which is provided with a conductor pattern. This conductor pattern is connected to lead frames of the package substrate.

Alternatively, the minute leads of the semiconductor chip may be replaced by minute projections or bumps of electrically conductive material provided on the chip in correspondence to the connection pads of the chip, and the semiconductor chip thus formed with the bumps is pressed against the substrate face downward under a suitably chosen temperature such that the bumps on the semiconductor chip develop a firm mechanical as well as electric connection with corresponding leads provided on the package substrate. These leads are of course connected to the lead frames at the periphery of the package substrate.

There is another known process of wireless bonding wherein the semiconductor chip formed with the bumps is not mounted directly on the package substrate but instead mounted first on a thin conductor foil which is patterned according to a predetermined conductor pattern corresponding to the bumps. This conductor pattern includes a terminal part acting as the leads for making a contact with the corresponding leads on the package substrate. The conductor foil is supported by a perforated plastic tape having an appearance somewhat similar to a movie film. In each of the regions corresponding to the frame of the movie film, the conductor pattern for one semiconductor chip is provided and this pattern is repeated a number of times along the tape.

This last process is known as the TAB (tape automated bonding) process and is particularly suitable for automatic assembling of the packaged semiconductor device. As will be understood from the foregoing description, the TAB process includes two distinct steps, i.e. the first step of thermocompression bonding for pressing the semiconductor chip against the tape such that the bumps on the semiconductor chip are bonded to corresponding leads on the tape, and the second step of gang bonding for connecting the leads in the terminal part of the tape to the corresponding patterns on the package substrate. The former step is called the inner lead bonding or ILB process and the latter step is called the outer lead bonding or OLB process. Upon completion of the OLB process, the desired connection of the semiconductor chip to the lead frames of the package substrate is achieved. It should be noted that the number of semiconductor chips mounted on the package substrate is not limited to one.

Meanwhile, the number of terminals and thus the number of lead frames to be formed on the package substrate is increasing with increasing integration density of the semiconductor device. Associated therewith, there occurs rather frequently a case in which the number of connections which are provided by the lead frames at the periphery of the package substrate is insufficient. In order to provide a sufficient number of connections, a so called pin grid array (PGA) structure is proposed, wherein a number of connection pins are provided in a row and column formation on the package substrate so as to project from the bottom of the package substrate. In the semiconductor device having the PGA structure, connection pins in the number of several tens to several hundreds can be easily provided on the package substrate.

In association with the use of the PGA structure providing an increased number of connection pins, a layered conductor structure is provided on the package substrate in order to achieve an effective connection between the leads on the semiconductor chip and the connection pins. In this layered conductor structure, more than one conductor layer of thin metal or the like is provided with respective conductor patterns, and the conductor patterns of the different levels are interconnected by a hole.

FIG. 1 shows, in perspective, a prior art packaged semiconductor device 10 having a package substrate 12 on which a semiconductor chip 11 is mounted, and FIG. 2 is an enlarged view of a part 100 marked by a circle in FIG. 1. Referring to FIG. 1 or FIG. 2, the substrate 12 may be a ceramic substrate made of alumina or aluminum nitride. On the substrate 12, a layered conductor structure comprising two or more layers of conductors separated from each other by intervening insulator layers is provided. In the uppermost conductor layer of the layered conductor structure, there is formed a part 17 referred to hereinafter as a lead pattern comprising a number of thin conductor strips 17a–17g, so that each strip of the lead pattern 17 coincides with a corresponding lead 15 provided on the chip 11 by the TAB process. In this uppermost conductor layer, there is defined a lead pattern region 16 of length L for making contact with the leads 15. It should be noted that the semiconductor chip 11 is connected to the leads 15 by a solder bump 5 at the time of the TAB process. On the other hand, the lower conductor layer of the layered conductor structure is patterned into a number of pattern portions as will be described, and there is established an electrical connection between each of the pattern portions and a corresponding connection pin 19 provided on the package substrate 12.

It should be noted that the connection pins 19 are arranged in a row and column formation so as to project from the bottom surface of the substrate 12 through penetrating holes 12a. In other words, the semiconductor device 10 of FIG. 1 has the PGA structure. The conductor layers of different levels are connected to each other by a contact hole provided on the insulator layer. In a typical package, the number of the connection pins 19 provided on a single package substrate 12 may be several ten to several hundred. In correspondence to the increased number of the pins 19, the number of the conductor strips forming the lead pattern 17 may become several hundred. Thus, the conductor strips forming the lead pattern 17 are disposed with extremely small separation which may be less than 0.1 mm. In correspondence to the number of the conductor strips, the layered conductor structure provided on the package substrate 12 may include more than two layers of conductors.

FIG. 3 shows an example of the conductor pattern of the uppermost level and a lower level underlying the uppermost level conductor pattern in a same drawing. The part illustrated in FIG. 3 corresponds to a part 200 marked by a circle in FIG. 1. In the drawing, there are shown a lower level conductor layer 14 provided directly on the package substrate 12, an insulator layer 13 of polyimide and the like provided on the layer 14, and the lead pattern 17 provided on the insulator layer 13 as the uppermost level conductor layer. The conductor layer 14 is patterned into a number of portions respectively connected to corresponding connection pins 19 via the penetrating holes 12a extending through the package substrate 12.

FIG. 4 shows a cross-sectional view of the structure of FIG. 3 taken along a line 3—3'. As will be seen in FIG. 3, the lead pattern 17 formed in the uppermost level conductor layer is connected to the lower level conductor layer 14 via a contact hole 18, and the lower level conductor layer 14 is connected to the connection pin 19 by a conductive member 12b filling the penetrating hole 12a.

When such a layered structure is employed for the conductor pattern on the surface of the package substrate 12, there appears a tendency that the top surface of the lead pattern 17 at the uppermost conductor layer will vary. Particularly, as a result of the patterning provided in the lower layer 14, there appears a lateral gap g between adjacent conductor patterns of the lower conductor 14. When such a gap g is formed, the top surface of the insulator layer 13 is depressed and as a result, the level of the lead pattern 17 is inevitably decreased in correspondence to the gap g. As the lead pattern 17 is the part for making the contact with the leads 15 provided on the semiconductor chip 11, such a change in the level of the conductor layer results in the failure, of proper electrical as well as mechanical connection between the semiconductor chip and the connection pins 19.

In order to eliminate the problem of failure of the electrical connection, there is proposed to use a filler material or filler pattern 14a of an insulating material so as to fill the gap g between adjacent conductor layers 14. This filler patter 14a is illustrated in FIG. 2 and FIG. 3. By using the filler pattern 14a, the depression formed as a result of the absence of the conductor layer in the gap g is expected to be compensated and the decrease in the level of the lead pattern 17 in correspondence to the region of the gap g would substantially be reduced.

However, the control of the position and thickness of the filler pattern 14a is difficult because of the fine patterning of the lead pattern 17, and associated therewith, there occurs rather often a case in which the top surface of the lead pattern 17 on the gap g is still offset from the level of other lead patterns 17 as shown in FIG. 3 by an offset $+/-\delta$. When the offset $\delta$ is negative and the level of the lead pattern 17 on the gap g is still lower than the level of other lead patterns 17, the electrical contact still fails as in the case of a lead pattern 17b in FIG. 2. On the other hand, when the offset $\delta$ is positive and the lead pattern 17 on the gap g is projecting upwards relative to other lead patterns 17 as in the case of a conductor strip 17e in FIG. 2, the lead pattern 17 may either be deformed laterally as illustrated or flattened at the time of the thermocompression bonding. Further, the pressure needed for the thermocompression bonding may be prevented from being transferred to the adjacent conductor strips 17d and 17f when the conductor strip 17e is projected upwards. Thus, the projection of the lead pattern 17 also gives the improper electrical connection. As the connection of the lead pattern 17 to the leads 15 on the semiconductor chip 11 is made by the gang bonding process, an offset of the level of even about 2-3 μm is adversary to the reliable contact.

As described heretofore, such a projection or depression is inevitable in the lead pattern 17 particularly when it is provided on the layered conductor structure including the gap g in the lower level conductor layer 14. To make the matter worse, the gap g extends in a direction generally parallel to the conductor strips 17a-17g forming the lead pattern 17. Thus, in the case of FIG. 2, the failure occurs for substantially the entire length of the conductor strip 17b or 17e.

SUMMARY OF THE INVENTION

Accordingly, it is a general object of the present invention to provide a novel and useful packaged semiconductor device wherein the foregoing problems are eliminated.

Another object of the present invention is to provide a semiconductor device formed on a package having the PGA structure, the package carrying a multi-level interconnection structure for connecting the semiconductor device and connection pins arranged so as to form the PGA structure, wherein a reliable electrical connection is achieved by a thermocompression bonding process.

Another object of the present invention is to provide a semiconductor device comprising: a semiconductor chip; a substrate for supporting the semiconductor chip; a plurality of terminal pins provided on the substrate for external connections; a plurality of lead wires provided on the semiconductor chip for connections to the terminal pins; and a multilevel interconnection structure for connecting the plurality of terminal pins to the plurality of lead wires on the semiconductor chip, said multilevel interconnection structure comprising at least a lower conductor layer provided on the substrate directly, said lower conductor layer being patterned into a plurality of pattern portions connected electrically to the terminal pins, an insulator layer provided on the lower conductor layer, and an upper conductor layer provided on the insulator layer, said upper conductor layer being formed with a connection area immediately below the lead wires when the semiconductor chip is mounted on the substrate, said upper conductor layer being patterned into a plurality of conductor strips corresponding to the lead wires, said insulator layer being provided with contact holes so as to connect electrically the conductor strips thereon with the pattern portions of the lower conductor layer therebelow; wherein each of said pattern portions in the connection area has an edge extending obliquely to the conductor strips of the upper conductor layer, said pattern portions being disposed so that a pair of adjacent pattern portions have respective edges opposing each other and extending parallel with each other with a lateral gap from which the lower conductor layer is removed extending therebetween. According to the present invention, the area of the conductor strip which crosses the lateral gap is reduced because of the steep angle formed between the edge and the conductor strip. It should be noted that the lateral gap in the lower conductor layer is transferred to the insulator layer and forms a depression on a top surface of the conductor strip in correspondence to the lateral gap. By reducing the area of the conductor strip which crosses such a depression, a firm, reliable contact can be developed between the conductor strips of the uppermost conductor layer and the lead wires of the semiconductor chip when the semiconductor chip is mounted on the substrate and a thermocompression bonding process is applied. An angle of about 45 degrees is preferred for the angle between the conductor strip and the edge of the patterned portion. Further, the lateral gap formed in the lower conductor layer may be filled by a suitable filler material.

Other objects and further features of the present invention will become apparent from the following detailed description when read in conjunction with the attached drawings.

DESCRIPTION OF THE PREFERRED EMBODIMENTS

Figure 5:
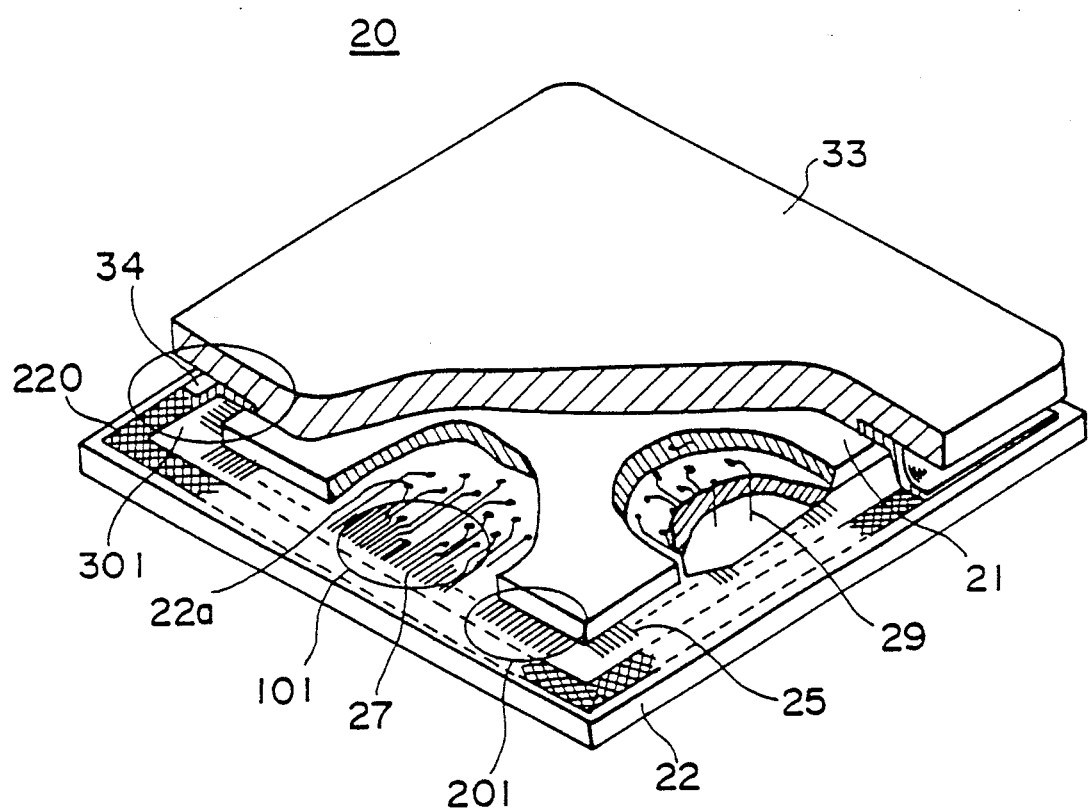
FIG. 5 is a perspective view showing the semiconductor device according to a first embodiment of the present invention in a state that a semiconductor chip is mounted on a package substrate and a heat sink structure is provided thereon.

FIG. 5 shows, in perspective, a semiconductor device 20 according to a first embodiment of the present invention.

Referring to FIG. 5, the semiconductor device 20 comprises a silicon semiconductor chip 21 carrying a plurality of lead wires 25 of copper or gold provided thereon by the TAB process. When the lead wires 25 are made of copper, a coating of tin is provided thereon. In a typical example, each of the lead wires 25 has a cross section of 40 $\mu$m × 30 $\mu$m, and about one hundred such lead wires are provided on each edge of the semiconductor chip 21.

The semiconductor chip 21 is mounted on a ceramic package substrate 22 made of aluminum nitride having a thickness of 0.6 mm, and a plurality of connection pins 29 of KOVAR (registered trademark) each having a diameter of 0.15 mm are projected downwards from the substrate 22 in correspondence to penetrating holes 22a provided therethrough. The pins 29 are coated by nickel and arranged in a row and column formation and form the PGA structure. On the substrate 22, a cap 34 made of KOVAR is provided around the periphery thereof, and a heat sink 33 for radiating the heat is mounted on the cap 34.

Figure 6:
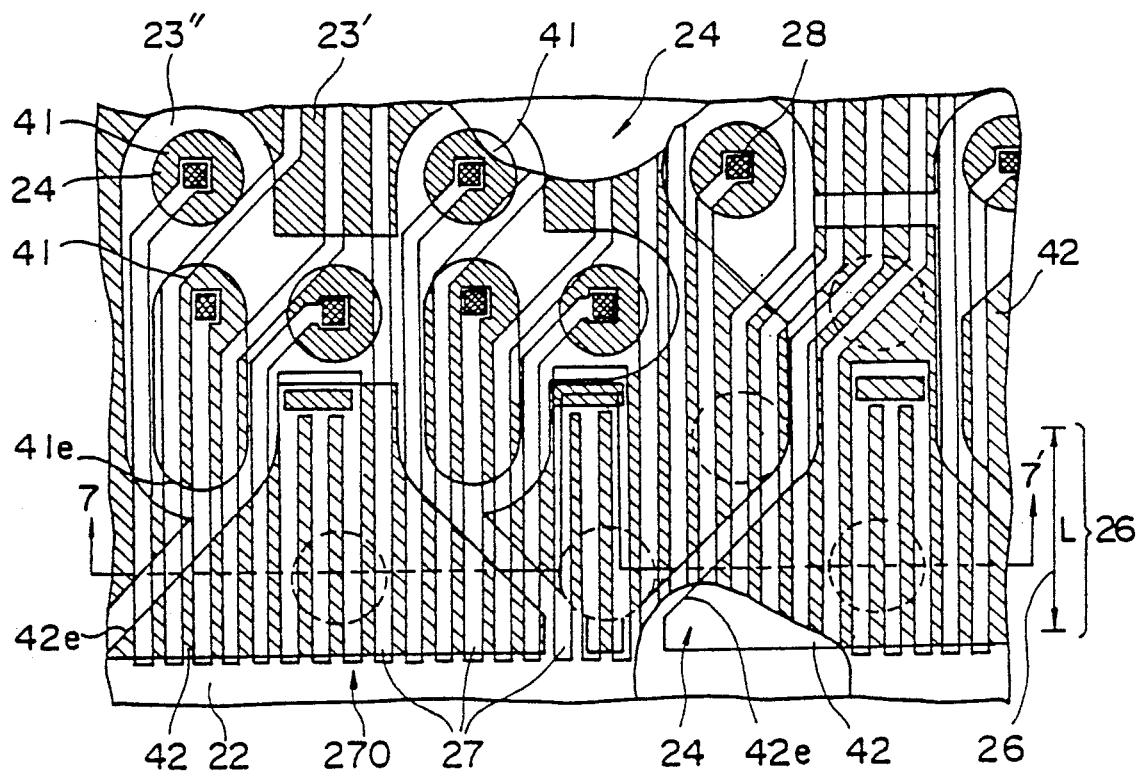
FIG. 6 is a plan view showing a part of the semiconductor device.
Figure 7:
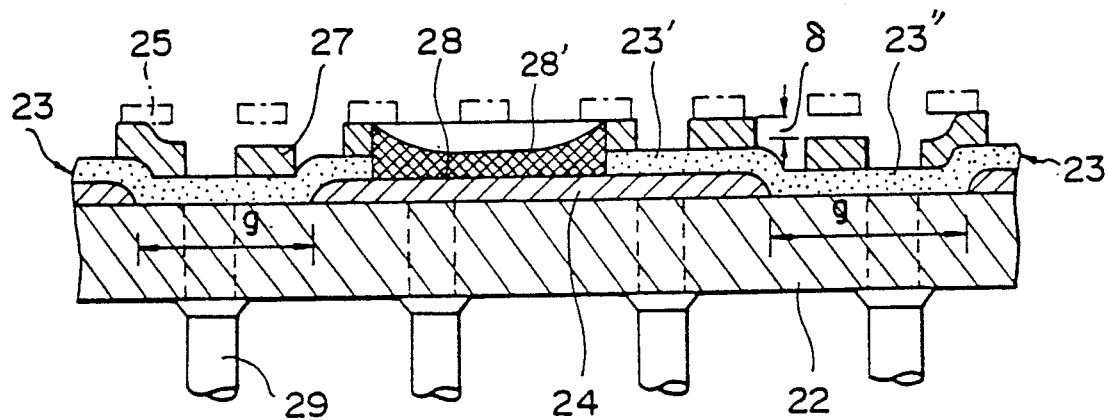
FIG. 7 is a cross-sectional view showing a cross-section of FIG. 6 taken along a line 7—7'.

FIGS. 6 and 7 show the package substrate 22 in detail. The part illustrated in FIG. 6 corresponds to a part 101 marked by a circle in FIG. 5. On the substrate 22, a lower conductor layer 24 of a titanium-copper alloy is deposited by sputtering for a thickness of about 8 $\mu$m such that the conductor layer 24 is connected electrically to the pins 29. This lower conductor layer 24 is subsequently patterned by a photolithographic process such that there are formed first type patterns 41 of relatively small size and second type patterns 42 of relatively large size. The first type pattern 41 is characterized by a small parasitic capacitance because of the reduced contact area and is used as the pattern for conducting signals. On the other hand, the second type pattern 42 is used as the power conductor because of the increased area which is advantageous in the reduction of the specific resistance. It should be noted that there are a number of first type patterns 41 and second type patterns 42 on the substrate 22. The area of the pattern 42 is chosen as large as possible so as to increase the flat surface region of the multi-level interconnection structure.

On the lower conductor layer 24, an insulator layer 23 of polyimides and the like is provided for a thickness of 10 $\mu$m by the spin coating process, and on this insulator layer 23, an upper conductor layer 270 of aluminum-copper alloy is provided by sputtering for a thickness of about 12 $\mu$m. In this upper conductor layer 270, there is defined a lead pattern region 26 for making contact with the leads 25 on the semiconductor chip 21, and the upper conductor layer 270 is patterned in this region 26 into a number of lead pattern conductor strips 27 extending in parallel with each other for contacting with corresponding leads 25 on the chip 21. In one example, each conductor strip 27 has a width of 60 $\mu$m, and about one hundred conductor strips 27 are provided in each edge of the semiconductor chip 21 with a pitch of about 100 $\mu$m or less, preferably with a pitch of 30-50 $\mu$m, to form the lead pattern region 26. The lead pattern region 26 has a length L which may be about 200 $\mu$m. Each of the conductor strips 27 is connected to the first or second type patterns in the lower conductor layer 24 via contact holes 28 which receive conductive filler 28.

From the viewpoint of increasing the flat surface region in the multi-level interconnection structure, it is preferred to dispose the patterns 41 and 42 as close as possible on the substrate 22 and reduce the lateral gap g between the patterns. This lateral gap g is shown clearly in FIG. 7. Similarly to the prior art semiconductor device 10, the surface of the insulator layer 23 has a depression $\delta$ in correspondence to the gap g as shown in FIG. 7, and in this region the lead patterns 27 are depressed correspondingly. In FIG. 6, the part of the insulator layer 23 filling the lateral gap g and having a depressed top surface in correspondence thereto is shown by an area 23" represented as the white or blank region while the part of the insulator layer 23 located above the first or second type patterns 41, 42 is represented by an area 23' marked by the hatching.

When such a depression exists in the lead patterns 27, the depressed part of the lead patterns 27 is not contacted with the lead wires 25 of the semiconductor chip 21 even when the semiconductor chip 21 is thermocompressed on the package substrate 22. Thus, it is desired to decrease the gap g as much as possible. However, because of the necessity to secure a sufficient margin against the possible variation of patterning of the lower conductor layer 24, the size of the gap g cannot be reduced below about 50 $\mu$m at the present time. It should be noted that the package substrate 22 made of ceramics has a relatively rough surface and the patterning performed on such a ceramic substrate cannot be performed with the precision comparable to that on the semiconductor substrates or polyimide layers having an excellently smooth surface. Such a gap g is necessary also because the penetrating holes 22a in the package substrate 22 are provided prior to the sintering of the substrate 22 while the substrate 22 is still in the state of a green sheet and one has to consider the shrinkage of the substrate 22 which can reach as much as about 15 %. In response to the shrinkage of the substrate 22, the position of the penetrating holes 22a may change by several ten microns. Even though such a change in the position of the penetrating holes 22a can be taken into consideration at the time of forming the holes 22a in the green sheet of the substrate 22, there can be an uncontrolled variation in the shrinkage each time the substrate is sintered. In order to accommodate such a variation, the foregoing gap g having the size of about 50–100 $\mu$m cannot be eliminated.

In the present invention, the area of the lead pattern 27 crossing the gap g is minimized by designing the patterns 41 and 42 such that the patterns 41 and 42 have oblique edges 41e and 42e in the lead pattern region 26 such that the oblique edges 41e and 42e cross with each of the conductor strips 27 passing thereabove with an angle of about 45 degrees. In order to minimize the gap g, it is preferable that these edges 41e or 42e extend parallel with each other. The edges 41e and 42e are illustrated clearly in FIG. 8. According to the present invention, the depressed portion of the conductor strips 27 formed as a result of passing across the gap g is minimized while securing a sufficient gap g between the adjacent patterns 41 or 42. Thus, the area of the depressed region of the conductor strips 27, shown in FIG. 8 to have a length 1, is minimized and the reliability of the electric contact is increased. It should be noted that the conductor strips 27 are formed on the polyimide insulator layer 23 and thus can be patterned with precision because of the smooth surface of the insulator layer 23.

Hereinafter, a more detailed description of the contact structure of FIG. 8 will be given. The part illustrated in FIG. 8 corresponds to a part 201 marked by a circle in FIG. 5.

Figure 8:
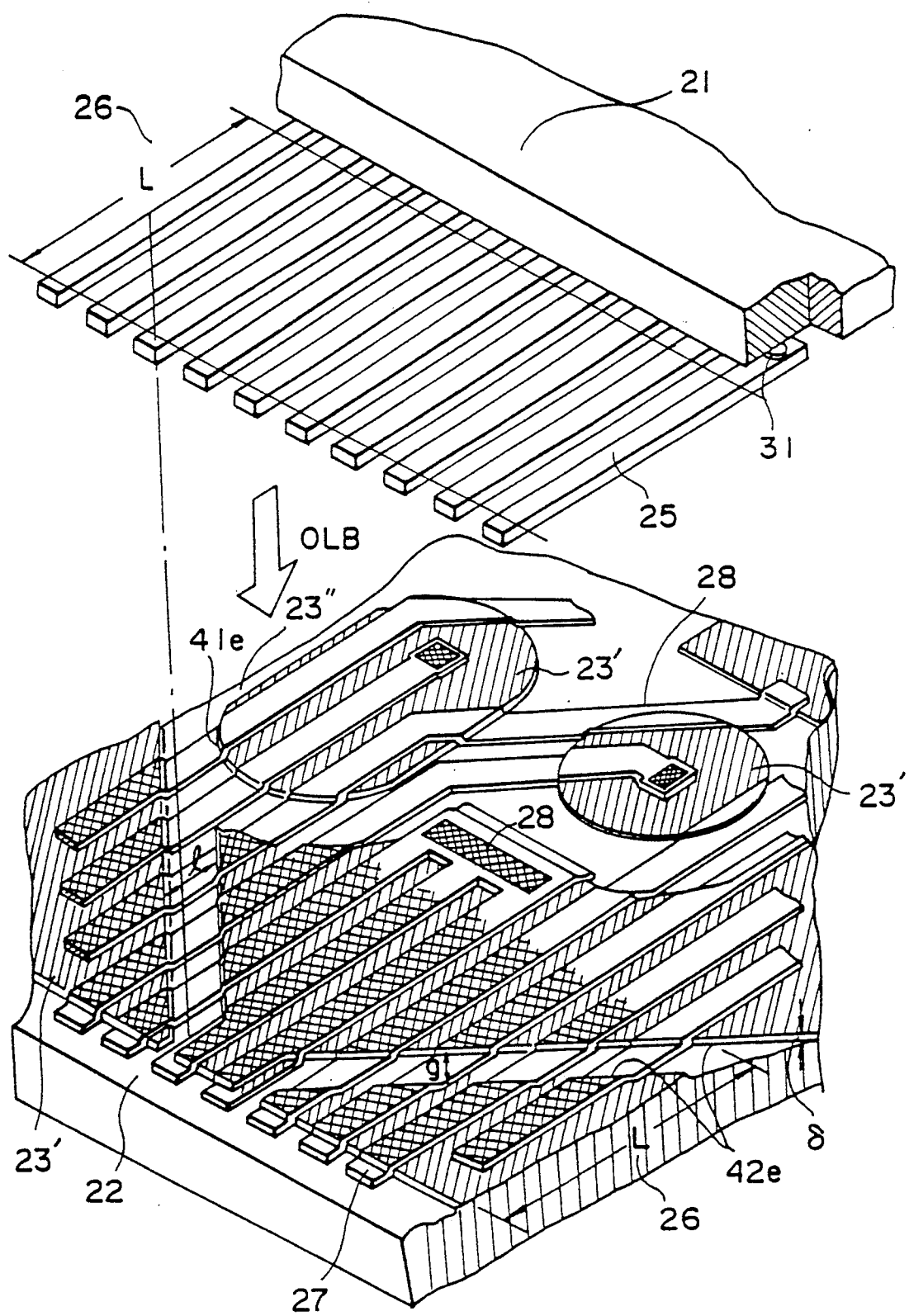
FIG. 8 is an exploded view showing another part of FIG. 5 in an enlarged scale.

Referring to FIG. 8, the part of the conductor strips 27 which is actually connected to the lead wires 25 on the semiconductor chip 21 is the part which exists on the portion 23' of the insulator layer 23 located above the pattern 41 or 42, while the part of the conductor strip 27 which exists on the portion 23'' of the insulator layer 23 provided directly on the substrate 22 in correspondence to the gap g is not contacted with the lead wires 25 because of the reduced height or level. In a structure wherein the lower conductor pattern 24 has a thickness of 8 $\mu$m and the insulator layer 23 has a thickness of 10 $\mu$m, it was found that there appears a step $\delta$ of about 6.2 $\mu$m in the average as shown in FIG. 7 between the level of the conductor strip 27 existing on the insulator layer 23' and the conductor strip 27 existing on the insulator layer 23''. Thus, the lead wire 25 bridges across conductor strip 27, which is provided on the insulator layer 23'', and no contact is made between the lead wire 25 and the lead pattern on the insulator layer 23''. In the present invention, the area of the conductor strip 27 provided on the insulator layer 23'' is minimized by arranging the edges 41e and 42e such that these edges extend parallel with each other and cross with the conductor strips 27 at the angle of about 45 degrees. The conductor strips 27 which are located on the insulator layer 23' showed a variation of the level in the order of $+/-0.7$ $\mu$m which is sufficiently small for establishing a uniform, reliable contact.

The applicants have made a measurement of the mechanical strength of the connection thus achieved on the samples of the semiconductor device wherein the semiconductor chip 21 is connected to the substrate 22 by the TAB process using the gang, which includes connecting the chip 21 to the leads 25 by a solder bump 31. bonding. According to this measurement, it was found that, when the length L of the lead pattern region 26 is set to be 200 $\mu$m, a sufficient mechanical strength can be obtained by choosing the length of the conductor strip 27 making the contact with the lead wire 25 to be at least larger than about 100 $\mu$m. This means that it is preferable to choose the length 1 of the conductor strip 27 (FIG. 8) to be smaller than about 100 $\mu$m. This value of 1 cannot be reduced below about 50 $\mu$m because of the reasons described previously.

The semiconductor device thus obtained is then sealed hermetically by providing a heat sink and a cap. As such a process of sealing the semiconductor device is thought to induce a strain in the semiconductor device, the applicants made a study to evaluate the effect of sealing on the mechanical strength of the connection.

Figure 9:
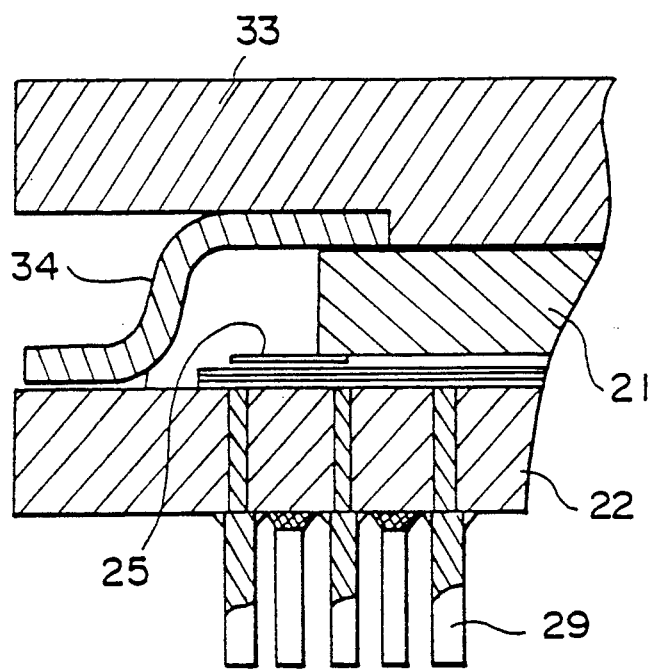
FIGS. 9 and 10 are diagrams showing the mounting of the heat sink in the case of the semiconductor device of FIG. 5.
Figure 10:
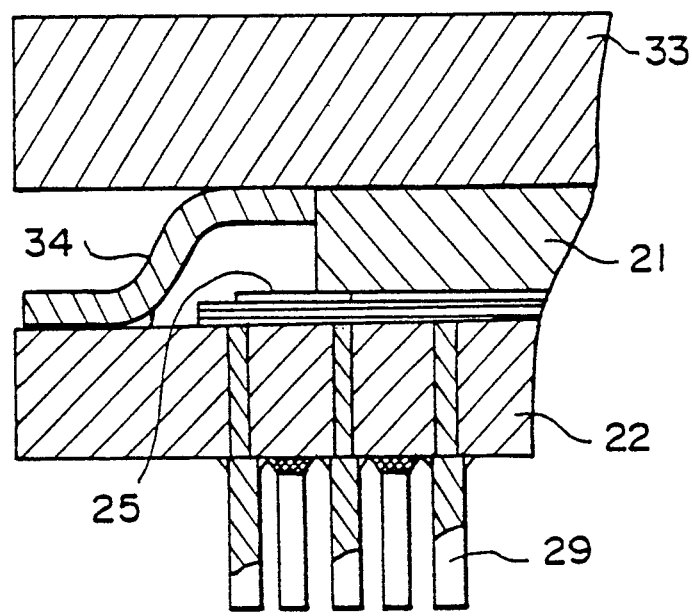

FIGS. 9 and 10 show the constructions of the completed device wherein a heat sink 33 of aluminum nitride having a thickness of 0.8 mm and coated by nickel for improving the thermal conduction is provided the chip 21. The parts illustrated in FIGS. 9 and 10 correspond to a part 301 marked by a circle in FIG. 5. The heat sink 33 was provided directly on the semiconductor chip 11 and the cap 34 of KOVAR (registered trademark) was used to seal hermetically the periphery of the semiconductor chip 21. In order to obtain an excellent connection between the cap 34 and the substrate 22, a metallization 220 shown in FIG. 5 by cross-hatching is provided on the substrate 22 along its periphery.

In the example of FIG. 9, the heat sink 33 is supported laterally by the cap 34 which extends to the top surface of the chip 21 and abuts with a corresponding shoulder part formed in the heat sink 33. By brazing the substrate 22, the cap 34 and the heat sink 33 with each other, there is formed a hermetically sealed space for accommodating the semiconductor chip 21, and the space thus formed is filled by nitrogen. In the construction of FIG. 10, the cap 34 supports the chip 21 laterally by abutting the side wall of the semiconductor chip 21. The space for accommodating the semiconductor chip 21 is filled by nitrogen similarly to the construction of FIG. 9.

In any of the foregoing constructions of FIG. 9 and FIG. 10, there arises a problem that a thermal stress may be applied to the conductor strips 27 and the lead wires 25 in response to a temperature change. Such a temperature change may be caused at the time of brazing and the like. In order to examine the reliability of the semiconductor device of the present invention with respect to such thermal stresses, the applicants have made an experiment wherein the structure of FIG. 9 and the structure of FIG. 10 were subjected to a thermal cycle process. The experiment was conducted according to the MIL-standard class A test in the temperature range between $-65°$ C. and $150°$ C., with ten minutes for each cycle. Even after such a severe thermal cycle test, no degradation of the mechanical strength was observed in the connection between the conductor strip 27 and the lead wire 25.

Figure 11:
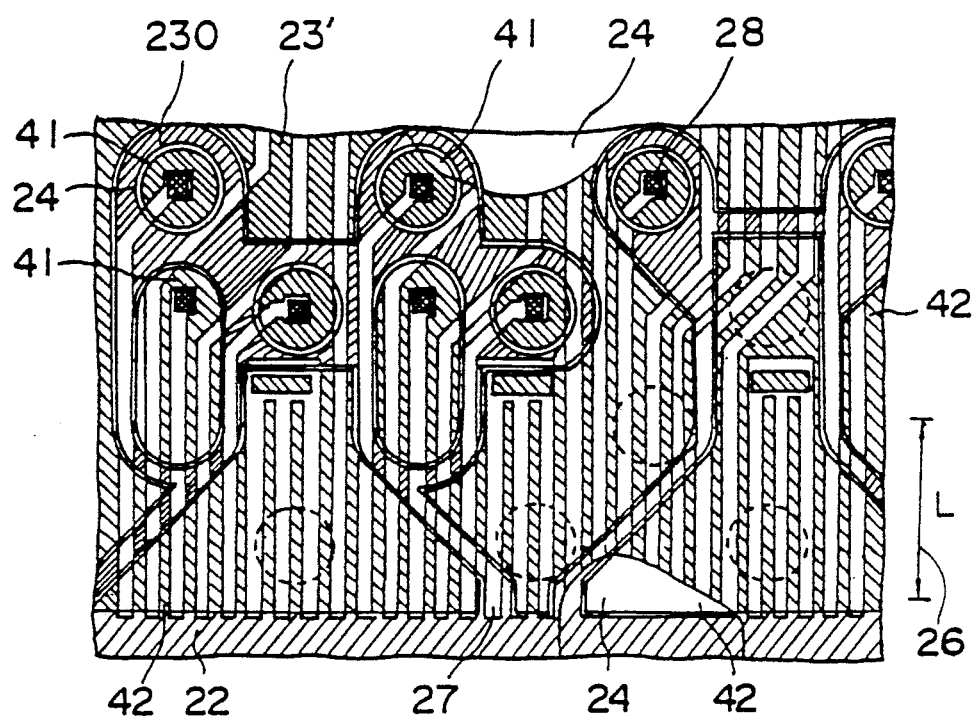
FIGS. 11 and 12 show a second embodiment of the present invention.
Figure 12:
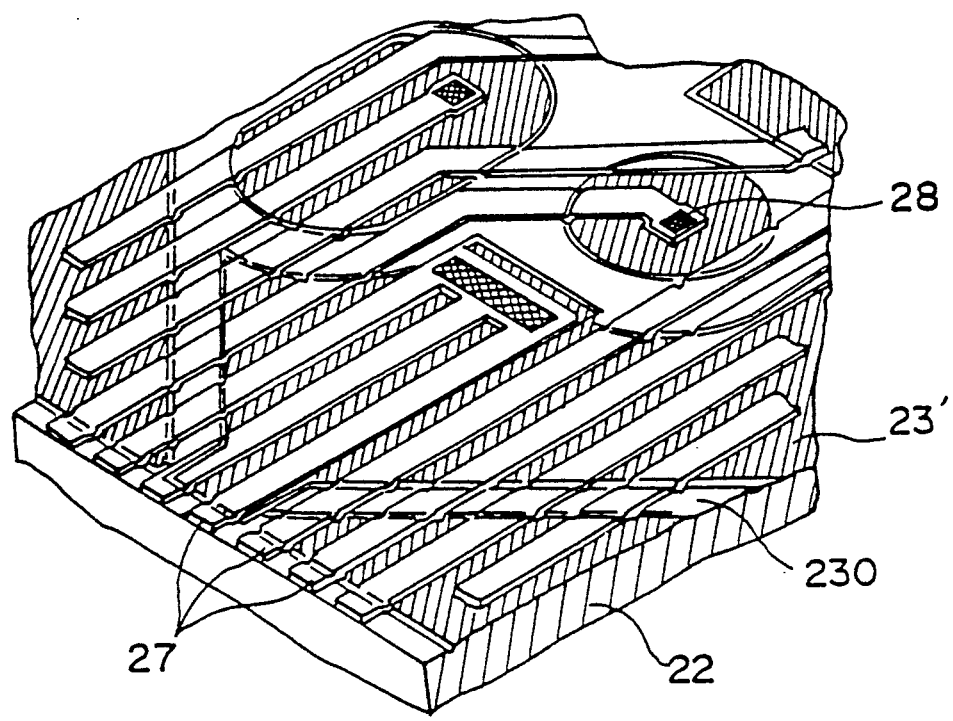

FIGS. 11 and 12 show a second embodiment of the present invention, wherein there is formed a projection 230 in the insulator layer 23 in correspondence to the part 23″ so as to fill the depression formed in correspondence to the part 23′. Other parts of the drawing are given identical reference numerals and the description thereof will be omitted. As is clearly seen in the perspective view of FIG. 12, the depression of the conductor strip 27 in correspondence to the part 23′ of the insulator layer 23 is compensated by the projection 230 and the area of the conductor strip 27 which does not make contact with the lead wire 25 is significantly reduced.

Figure 1:
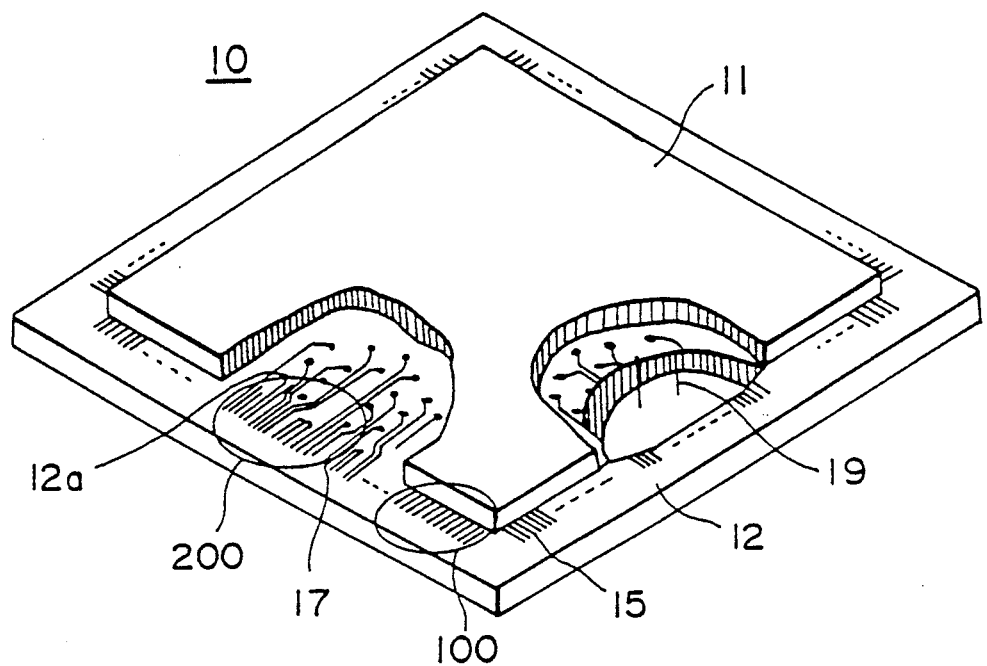
FIG. 1 is a perspective view showing a prior art semiconductor device mounted on a package substrate in a state that the heat sink structure is removed therefrom.
Figure 2:
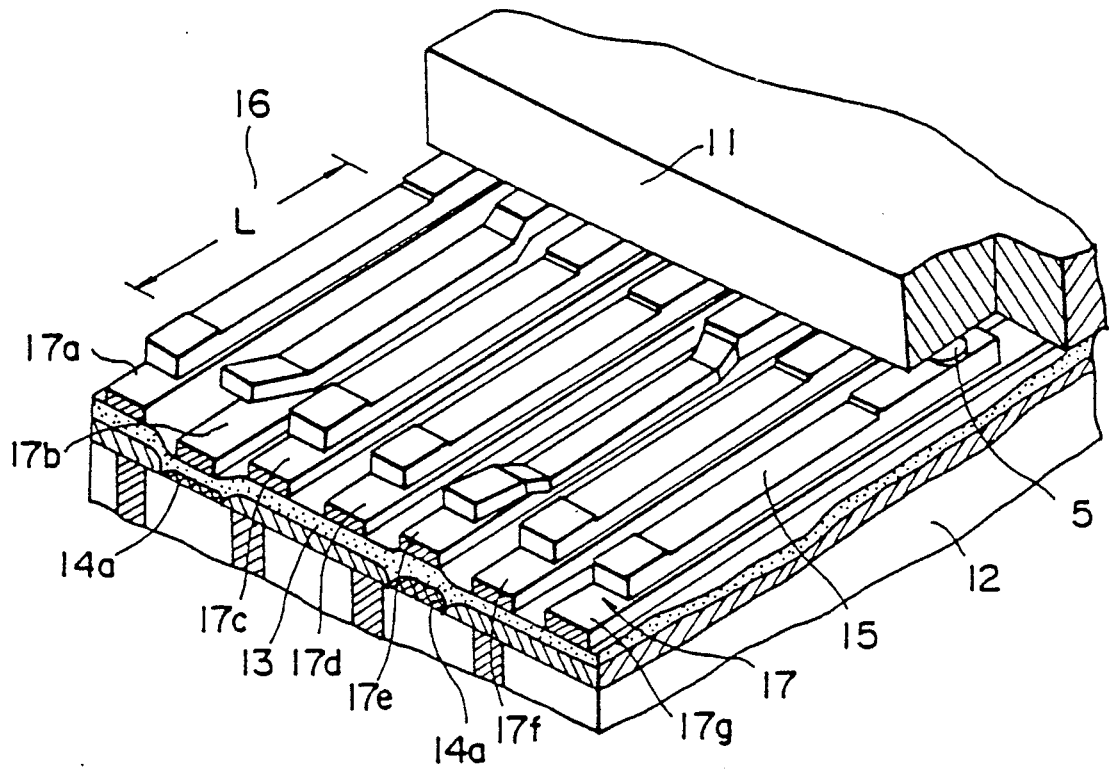
FIG. 2 is an enlarged perspective view showing a part of the device of FIG. 1.
Figure 3:
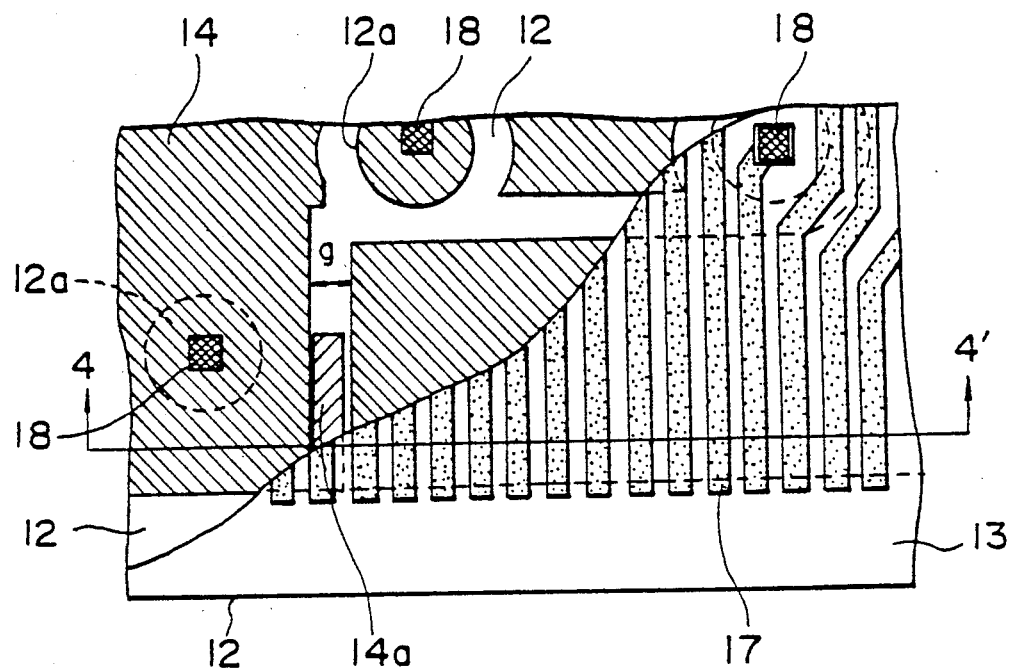
FIG. 3 is a plan view showing another part of the semiconductor device of FIG. 1 wherein the semiconductor device is shown at different levels.
Figure 4:
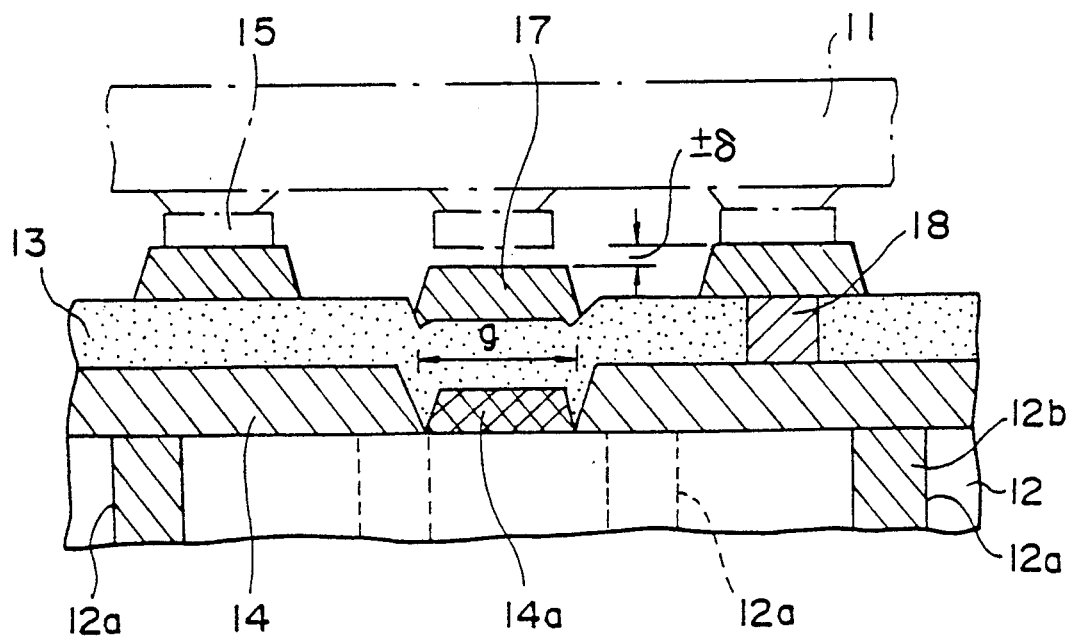
FIG. 4 is a cross-sectional view showing the semiconductor device along a 4—4' line of FIG. 3.

It should be noted that the compensation of the depression of the lead pattern 27 by the projecting filler insulator layer 230 is difficult in the case of the prior art device, as the lead pattern is patterned into numerous fine conductor strips as shown in FIG. 2. Filling such a gap between the conductor strips may even cause a worse result as already explained. In the case of the present invention, the gap g is not limited by the separation between the conductor strip forming the conductor pattern. In other words, the gap g can be set larger than about 100 $\mu$m as desired, and the difficulty in filling the gap g by the layer 230 does not occur. This embodiment is particularly effective in the case where the gap g has a width larger than about 100 $\mu$m.

Figure 13A:
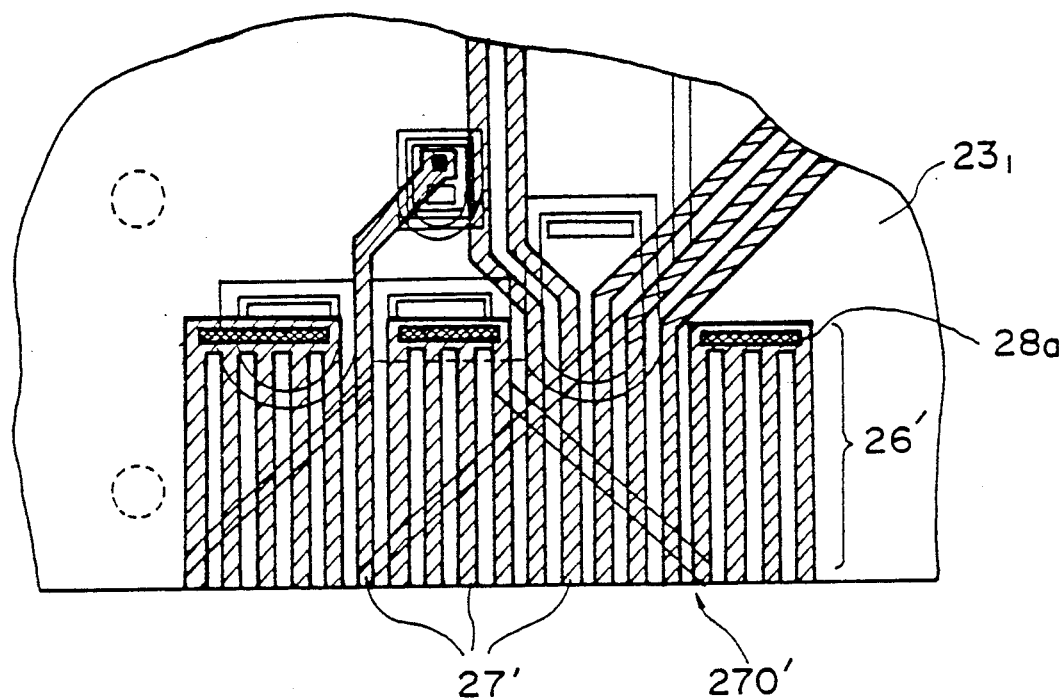
FIGS. 13A-13C show a third embodiment of the present invention.
Figure 13B:
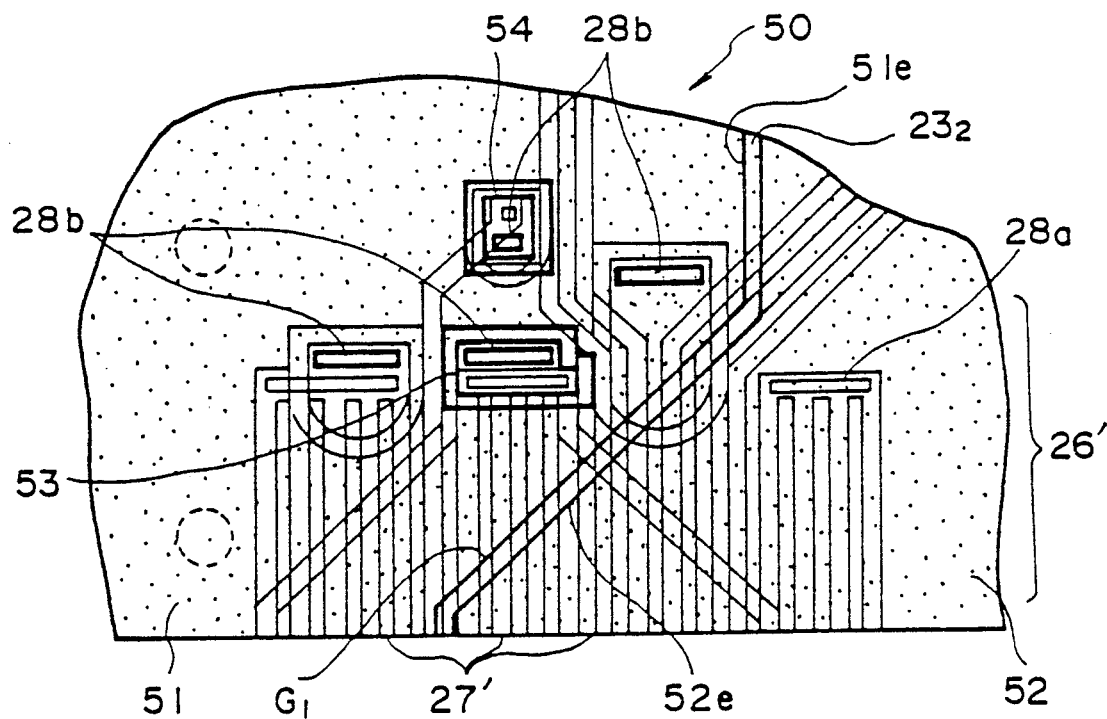
Figure 13C:
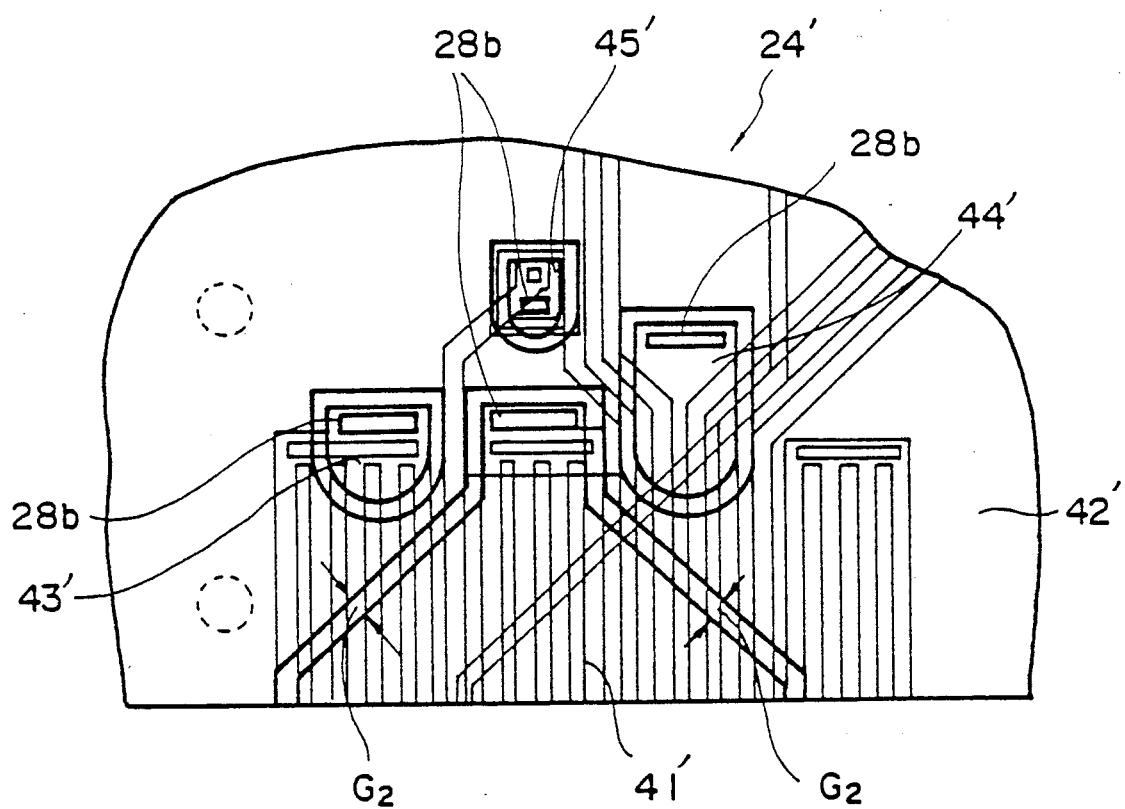

FIGS. 13A–13C show a third embodiment of the present invention wherein there are three conductor layers in a connection region 26′ corresponding to the connection region 26 of the first embodiment.

Referring to FIG. 13A showing a plurality of parallel conductor strips 27′ corresponding to the conductor strips 27 of the first embodiment, the conductor strips 27′ are provided on an uppermost insulator layer $23_1$ as a result of patterning of an uppermost conductor layer 270′ and are connected to an underlying intermediate level conductor layer via contact holes 28a which are provided on the insulator layer $23_1$. Under the insulator layer $23_1$, an intermediate level conductor layer 50 shown in FIG. 13B is provided in electrical connection with the conductor strips 27′ via the foregoing contact holes 28a. The intermediate conductor layer 50 is patterned into a number of pattern portions 51–54 and the like as illustrated wherein the pattern portions 51 and 52 provided in the connection region 26′ have edges 51e and 52e which extend obliquely with respect to the elongating direction of each conductor strip 27′. As can be seen in FIG. 13B, the pattern portions 51 and 52 are disposed such that the edges 51e and 52e extend parallel with each other with a gap G1 extending therebetween.

Through this gap G1, an insulator layer $23_2$ underlying the intermediate conductor layer 50 is exposed. The insulator layer $23_2$ is provided with contact holes 28b for connecting electrically the conductor layer 50 with an underlying lowermost conductor layer 24′ which is provided directly on the substrate 22.

FIG. 13C shows the lowermost conductor layer 24′. As can be seen in this drawing, the lowermost conductor layer 24′ is patterned into pattern portions 41′–45′ and the like wherein each of the pattern portions 41′–45′ is connected to the corresponding pattern portion such as portions 51 and 52 via the contact holes 28b. Similarly to the first embodiment, the pattern portions 41′ and 42′ have respective edges 41e′ and 42e′ in the connection region 26′ such that the edges extend parallel with each other with a gap G2 therebetween and cross obliquely the conductor strips 27′ in the uppermost conductor layer.

In this embodiment, although the conductor strips 27′ in the uppermost conductor layer 270 are depressed in correspondence to the gaps G1 and G2 in the intermediate level conductor layer 50 and in the lowermost conductor layer 24′, such a depression is minimized by configuring the pattern portions 51 and 52 in the intermediate level and the pattern portions 41′ and 42′ in the lowermost level such that the gaps G1 and G2 cross the conductor strips 27′ obliquely preferably with an angle of 45 degrees. These gaps G1 and G2 may be filled by insulator materials similarly to the second embodiment such that the depression of the conductor strips 27′ is compensated.

In any case, it is now clearly shown that the present invention for improving the contact between the conductor strips 27 or 27′ with the lead wires 25 on the semiconductor chip by optimizing the configuration, i.e. the shape and arrangement, of the conductor patterns underlying the conductor strips, is applicable to the package substrate carrying thereon three or more conductor layers as the multi-level interconnection structure.

Further, the present invention is not limited to these embodiments described heretofore but variations and modifications may be made without departing from the scope of the invention.

What is claimed is:

1. A semiconductor device, comprising:
   a semiconductor chip;
   a substrate having an upper major surface, and a lower major surface for supporting the semiconductor chip on the upper major surface thereof;
   a plurality of terminals provided on the substrate for external connection, said plurality of terminals being provided to project from the lower major surface of the substrate;
   a plurality of lead wires provided on the semiconductor chip for electrical connection to the plurality of terminals; and
   a multilevel interconnection structure for connecting the plurality of terminals to the plurality of lead wires on the semiconductor chip, said multilevel interconnection structure including
      a lower conductor layer having an upper major surface, and a lower major surface provided on the upper major surface of the substrate, said lower conductor layer being patterned into a plurality of isolated patterns each surrounded by a boundary and connected electrically to at least one terminals, said plurality of isolated patterns exposing a part of the upper major surface of the substrate therebetween;

an insulator layer having an upper major surface, and a lower major surface provided on the lower conductor layer such that the lower major surface of the insulator layer covers the upper major surface of the lower conductor layer an the exposed part of the upper major surface of the substrate, said upper major surface of the insulator layer forming a depression corresponding to the exposed part of the upper major surface of the substrate;

a plurality of contact holes provided in the insulator layer for exposing the upper major surface of the lower conductor layer corresponding to the isolated patterns; and an upper conductor layer having an upper major surface, and a lower major surface provided on the upper major surface of the insulator layer, said upper conductor layer being patterned into a plurality of conductor strips each extending from a corresponding contact hole and connected to a corresponding isolated pattern at the contact hole, each conductor strip having a straight portion that extends parallel with each other corresponding to the plurality of lead wires for electrical connection therewith;

wherein certain of said isolated patterns have their boundary crossing the straight portions of the conductor strips and said certain isolated patterns are formed such that the boundary forms a liner edge that extends general linerarly in the plane of the upper major surface of the substrate and crosses, when viewed perpendicularly to the upper major surface of the substrate, the straight portions generally obliquely, said linear edge being formed to cross a plurality of the conductor strips.

2. A semiconductor device as claimed in claim 1, wherein said linear edge crosses the straight portion of the conductor strips with an angle of about 45 degrees, when viewed in the direction perpendicular to the upper major surface of the substrate.

3. A semiconductor device as claimed in claim 1, wherein said certain isolated patterns are formed such that the linear edge of each isolated pattern extends generally parallel with each other and such that a pair of opposing linear edges of adjacent isolated patterns are separated by a lateral gap, measured perpendicularly to the extending direction of the linear, edge, of at least 50 μm.

4. A semiconductor device as claimed in claim 1, wherein said depression formed in the upper major surface of the insulator layer is filled by an insulating material having a thickness to compensate the depression.

5. A semiconductor device as claimed in claim 1, further comprising:

an intermediate conductor layer having an upper major surface, and a lower major surface provided on the upper major surface of the insulator layer, said intermediate conductor layer being patterned into a plurality of intermediate level isolated patterns corresponding to the plurality of isolated patterns of the lower conductor layer, with an exposed upper major surface of the insulator layer formed between the intermediate level isolated patterns, each of said plurality of intermediate level isolated patterns being connected to the corresponding isolated pattern of the lower conductor layer via a contact hole in the insulator layer; and an intermediate insulator layer having an upper major surface, and a lower major surface provided to cover the upper major surface of the intermediate level isolated patterns and the exposed upper major surface of the insulator layer, said surface thereof supports the plurality of conductor strips of the upper conductor layer and formed with a plurality of contact holes for connecting the conductor strips to the corresponding intermediate level conductor patterns, wherein said intermediate conductor pattern has a linearly extending boundary corresponding to the straight portions of the conductor strips such at a pair of adjacent intermediate conductor patterns have opposing linear boundaries that extend parallel with each other in an oblique direction when viewed perpendicularly to the major surface of the substrate.

6. A semiconductor device as claimed in claim 3 in which said lateral gap is about 100 μm.

7. A semiconductor device as claimed in claim 1 in which said substrate comprises a ceramic body of aluminum nitride, said insulator layer comprises a layer of polyimide, and said lower conductor layer an said upper conductor layer comprises metal layers provided by sputtering.

8. A semiconductor device as claimed in claim 7 which said lower conductor layer has a thickness of about 8 μm, said insulator layer has a thickness of about 10 μm, said upper conductor layer has a thickness of about 12 μm.

9. A semiconductor device as claimed in claim 1 in which each of said plurality of conductor strips has a width, measured perpendicularly to an elongated direction of the conductor strip in a plane parallel to the upper major surface of the substrate, of about 60 μm.

10. A semiconductor device as claimed in claim 1 in which said terminals are arranged in a row and column formation to form a pin grid array.

* * * * *